United States Patent [19]

Cogan et al.

[11] Patent Number: 5,406,280
[45] Date of Patent: Apr. 11, 1995

[54] DATA RETRIEVAL SYSTEM USING COMPRESSION SCHEME ESPECIALLY FOR SERIAL DATA STREAM

[75] Inventors: Douglas N. Cogan, Brookfield; Burkhardt T. Hufnagel, Mount Prospect; Yan Gu, Chicago, all of Ill.

[73] Assignee: Commerce Clearing House, Riverwoods, Ill.

[21] Appl. No.: 112,569

[22] Filed: Aug. 26, 1993

[51] Int. Cl.⁶ ............................................. H03M 7/30
[52] U.S. Cl. ...................................... 341/51; 341/50; 364/710.1
[58] Field of Search ..................... 341/50, 51, 55, 90, 341/99; 364/241.8, 710.1

[56] References Cited

U.S. PATENT DOCUMENTS

| | | | |
|---|---|---|---|
| 4,789,852 | 12/1988 | Bailey et al. | 341/50 |
| 4,906,991 | 3/1990 | Fiala et al. | 341/51 |
| 5,003,307 | 3/1991 | Whiting et al. | 341/51 |
| 5,142,282 | 8/1992 | Tobin et al. | 341/55 |

OTHER PUBLICATIONS

Gessner, R., "Huffman Data Compression", PC Techniques, Aug./Sep. 1991, pp. 45–52.
Nelson, M., *The Data Compression Book*, M&T Books, Redwod City, Calif., 1991, Chapter 8, pp. 233–311.
Dufort, M., "Getting the Least Out of Your Data", computer Language, May 1991, pp. 45–61.
Nelson, M. R., "LZW Data Compression", Dr. Dobb's Journal, Oct. 1989, pp. 29–36, 86–87.

*Primary Examiner*—Howard L. Williams
*Attorney, Agent, or Firm*—Fitch, Even, Tabin & Flannery

[57] ABSTRACT

A data retrieval system using a compression scheme especially for serial transmission, which does not inadvertently generate typical flow control codes, such as ASCII values less than 32. A personal computer with a modem is used to access a remote mainframe database. Retrieved data is compressed according to the scheme and transmitted over telephone lines. Compression is achieved by encoding a compressed byte pair in place of a recurring sequence of data longer than two bytes. The byte pair contains information as to the length and offset into the transmitted packet of a previous occurrence of the recurring sequence, so that it may be copied from previously received bytes. The length and offset are stored in the byte pair such that neither byte has an ASCII value typical of those used for controlling modems.

12 Claims, 6 Drawing Sheets

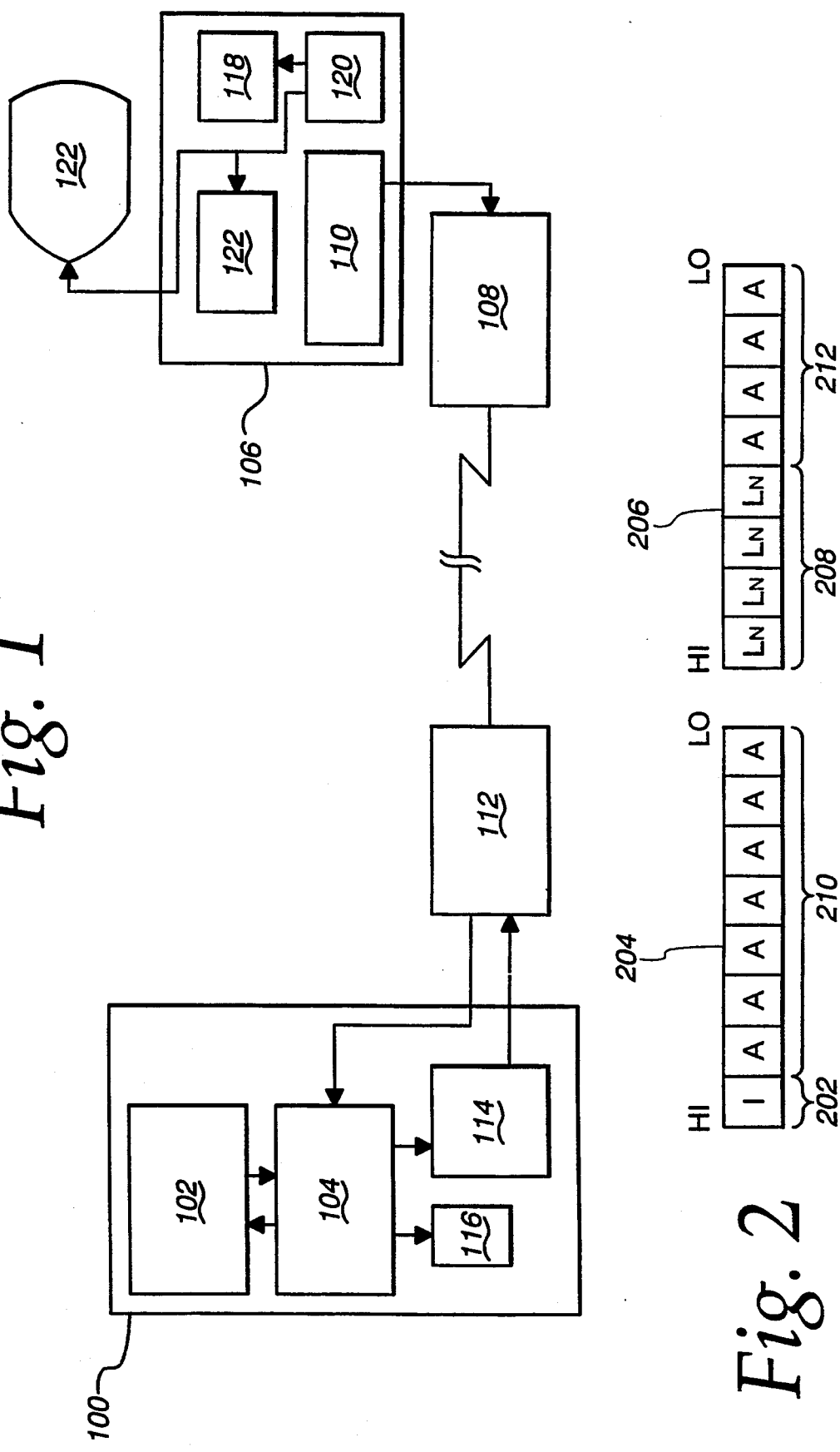

DATA RETRIEVAL SYSTEM USING COMPRESSION SCHEME ESPECIALLY FOR SERIAL DATA STREAM

BACKGROUND OF THE INVENTION

The present invention relates to an apparatus and method for retrieving data from a database in a remote computer via a serial transmission line. In particular, the invention provides a means of transmitting data in a compressed format according to a scheme which does not incidentally create codes typically used as flow control codes in serial data stream transmission equipment, like modems.

A plethora of databases are currently maintained in large, mainframe computers, and are made available to users of personal computers or other types of remotely located computers by transmission over telephone lines or other serial transmission means. To access the data stored in such a database, for example, a user may employ a personal computer with a modem and software for controlling the modem. The modem control software in conjunction with the modem allows the user to dial a database access telephone number, establish communication with a modem attached to the mainframe unit, and send data retrieval requests to the mainframe unit. In response, the mainframe unit sends the requested data, typically in packets of a given length in bytes.

The transmitted data commonly comprises textual data, though other data corresponding to numeric or graphical data may also be transmitted. Textual data may be transmitted in the widely-used ASCII format. According to this format, all letters of the alphabet, numbers and punctuation marks are assigned one of 128 different codes. According to a prevalent extended ASCII character set, 256 codes account for the original 128 characters, plus some graphical and scientific symbols, as well as some European letters not used in the English language. ASCII codes less than decimal-value 16 have traditionally been used as control codes for formatting the text, or as flow control codes, or both. As serial transmission equipment has become more complex, some ASCII codes greater than decimal-value 15 but less than decimal-value 32 have come to be used to control data flow.

Among the various concerns in transmitting a serial data stream is an interest in reducing the on-line time charges. To this end, any of a number of methods in the prior art may be used to compress the data to be transmitted, thereby decreasing the time of transmission, and reducing the period of waiting for the user. An example of such a compression scheme is Lempel-Ziv-Welch (LZW) compression.

A disadvantageous result of almost all compression schemes is that compressed bytes may be generated which have an ASCII code with a decimal-value between zero and 32. These codes may correspond to flow control commands, and when transmitted between serial transmission equipment, may cause unexpected results impacting on communications.

For example, though the LZW algorithm typically reserves the lowest 256 codes for the extended ASCII set, without compression, the algorithm requires data words of more than 8 bits, such as 12 bits for example. When these words are treated in 8-bit bytes, there exists the possibility of generating ASCII codes from 0 to 31, which may create unintentional effects on modem communications.

What is needed is a system for compressing data for serial transmission which cannot incidentally generate ASCII codes corresponding to flow control codes, e.g., codes of decimal-value less than 16 or 32, and for properly decompressing the compressed data at a receiving location.

SUMMARY OF THE INVENTION

The present invention provides a system for compressing data for serial transmission at a more rapid rate, which cannot incidentally generate flow control codes having ASCII decimal-values less than either 16 or 32, and for decompressing the data at the receiving computer.

A search request is transmitted by a user from a personal computer with a modem, for example, to a remotely located mainframe computer also having a modem and having a searchable database. Data is retrieved from the database by the mainframe and is divided into packets. Each packet is then compressed. A cyclical redundancy check, or the like, may be generated from the data before compression and added to the packet in an ASCII format for verification purposes.

The packet is analyzed to identify repeated sequences of text occurring in the packet. Second and greater occurrences of sequences of three or more bytes in the packet are compressed into two bytes. The two bytes are inserted in the data stream at each location where a repetition of that sequence occurs, and each pair encodes the address and length in bytes of the first occurrence of the sequence in the packet.

According to the invention, the manner of encoding the compressed sequence in two bytes assures that neither of the two bytes has a decimal value less than either 16 or 32, depending on the embodiment. The highest bit of the first byte is automatically set to one to signify the compressed sequence.

Bytes and sequences of bytes which do not meet the criteria for compression are passed on without change.

Upon receiving a packet, the requesting device first tests the highest bit of each byte in the packet. If the highest bit is zero, and the preceding byte in the packet is not the first byte of a compressed sequence byte pair, the byte is passed on as is, i.e., it was not compressed in the first place. If the highest bit of a byte is one, and the preceding byte is not a first byte of a compressed sequence byte pair, then it and the following byte in the packet define a compressed data. The two bytes in conjunction provide an offset to a previous address in the packet, and a number of bytes to copy starting from that previous address.

If a cyclical redundancy check is transmitted with the packet, it is used to verify the transmitted packet after decompression takes place.

BRIEF DESCRIPTION OF THE DRAWINGS

In the drawings:

FIG. 1 is a block diagram representing the overall scheme of the present invention;

FIG. 2 is a block diagram of a compressed sequence byte pair as used in the present invention;

DETAILED DESCRIPTION OF THE PREFERRED EMBODIMENT

Figure 3A:
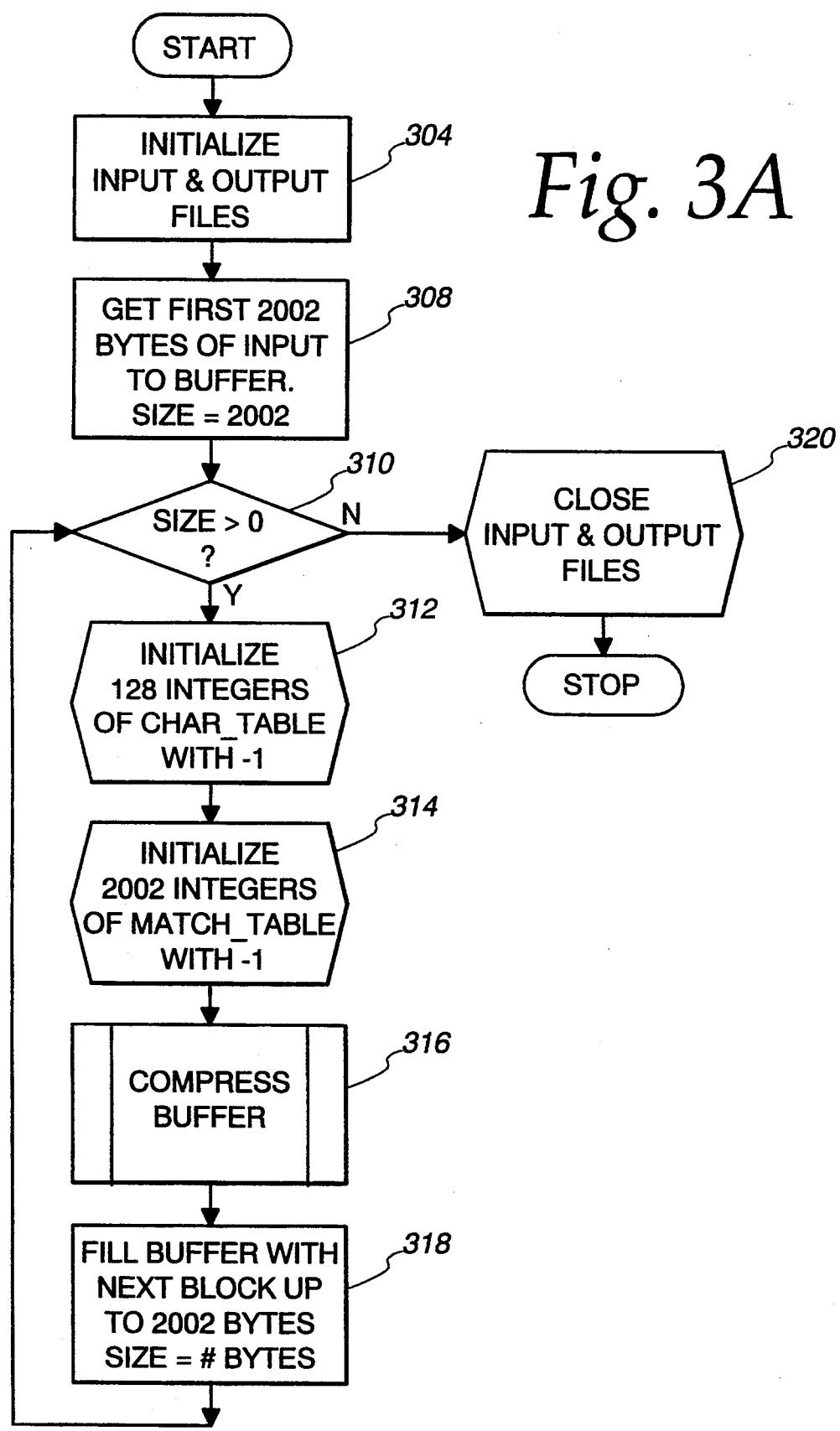
FIG. 3 is a flow chart of the compression scheme for the present invention, comprising FIGS. 3A, 3B and 3C.

The present invention provides a system for transmission of data retrieved according to a query request from a database via serial transmission at a more rapid rate, by compressing the data, while avoiding incidentally generating flow control codes having ASCII decimal-values less than either 16 or 32, depending on the embodiment. The present invention further provides a system for decompressing the data at a receiving computer.

FIG. 1 shows the overall scheme in which the present invention may be advantageously used. A mainframe 100, or a central processing system of similarly sufficient computing power, contains a database 102 which may be queried by a database management system 104. A user at a remote location desiring to access the database may use a personal computer 106, or the like, equipped with a serial transmission device 108, such as a modem, and a system 110 for generating query requests and flow control commands. The mainframe receives query requests over transmission lines via its own transmission device 112.

Data returned by the database manager system 104 in response to the request is passed to a compression engine 114. The compression engine 114 packetizes and compresses the data. Before compression, the compressed packets may optionally be processed in a cyclical redundancy check (CRC) generator 116, which generates a cyclical redundancy check for verification of the integrity of the each compressed packet upon receipt. The check is added to the data stream as the ASCII representation of the number generated. That is, if the CRC generated is hexidecimal 1234, it is represented as ASCII letter "1", followed by ASCII letter "2", and so on. The compressed packets are transmitted to the user via transmission device 112, which may be a modem.

Upon receipt of a compressed packet by modem 108, the compressed packet is sent to a decompression engine 120. Data decompressed by decompression engine 120 is subsequently passed to an output device 122, which may be a disk file or an I/O port, such as a serial port in communication with an attached modem, or the like. If a cyclical redundancy check scheme is being employed, the decompressed packet is simultaneously passed to the verification system 118, which regenerates a cyclical redundancy check and compares it to the cyclical redundancy check sent with the packet.

Alternatively, the cyclical redundancy check may be generated after compression at the mainframe and added to the serial data stream, and may be verified at the receiving station prior to decompression of the packet. However, this may generate undesirable flow control codes in the data stream, depending on the CRC algorithm used, and also has the disadvantage of requiring longer before decompressed data is displayed to the receiving station user.

As mentioned above, data retrieved by the database manager system 104 is preferably divided into packets. A packet may be typically 2002 bytes long, by way of example. Other packet sizes may be selected. Each packet is compressed separately; it is analyzed to identify repeated sequences of text occurring in the packet. Second and greater occurrences of sequences of three or more bytes in the packet are compressed into two bytes. The two bytes are inserted in the data stream at each location where a repetition of that sequence occurs, and each pair encodes the address and length in bytes of the first occurrence of the sequence in the packet.

According to the invention, the manner of encoding the compressed sequence in two bytes assures that neither of the two bytes incidentally encodes for a flow control code, that is, ASCII codes typically less than 16, or in some advanced transmission schemes, less than 32. Furthermore, the manner of encoding simply identifies compressed sequences to the receiving/decompressing unit, so that non-compressed sequences can be passed directly through decompression without processing.

Advantageously, the receiving unit need not be explicitly notified whether the incoming serial data stream is compressed or not. Compression can be entirely controlled from the sending end. It is thus convenient, for example, to attach a datascope to the receiving end for diagnostic purposes, without having to explicitly notify the receiving end that compression has been turned off at the sending end. At the initiation of communications, the receiving station may send a control code to the mainframe indicating that no compressed data should be sent. Thereafter, the receiving station need do nothing differently to receive the uncompressed code.

Turning to FIG. 2, this is achieved, according to the invention by setting the high bit 202 of the first byte 204 to one. No other bytes of data passing out of the compression scheme of the present invention must have a high bit set to one. Rather, all non-compressed bytes explicitly do not contain a one in the highest bit, and the second byte 206 of a compressed sequence pair need not have the highest bit set to one. As a consequence of this, the first byte 204 of the compressed sequence pair always has an ASCII value of 128 or higher. Therefore, the first byte 204 of a compressed sequence pair will never incidentally be a flow control code of ASCII value less than either 16 or 32.

The remaining 15 bits of the total of 16 bits of the pair are used to encode the offset from the start of the packet at which a previous occurrence of the compressed sequence may be found, and the length in bytes of that occurrence. Preferably, the offset may comprise eleven of these bits, and the length may comprise the remaining four bits. The four bits encoding the length are stored in the highest four bits 208 of the second byte 206. The highest seven of the eleven bits of the offset are stored in the lowest seven bits 210 of the first byte 204, while the lowest four bits of the eleven bits of the offset are stored in the lowest four bits 212 of the second byte 206.

In an alternative embodiment, the length may be encoded in the highest three bits of the second byte, and the offset may be contained in the combination of the lowest seven bits of the first byte and the lowest five bits of the second byte.

According to the invention, a recurring sequence will be compressed into two bytes only if its non-compressed length is three bytes or more. It is desirable to maximize the length of a recurring sequence which the four length bits can encode. Thus, it is preferable to subtract two from the true non-compressed length of the sequence and store the result in the four length bits 208. In this way, a compressed recurring sequence may have an non-compressed length of from three bytes to seventeen bytes. At the maximum length of seventeen bytes, the four length bits store the number fifteen, being two less than seventeen, and all four bits are one. When the non-compressed length is three, the number stored in the four length bits 208 is one, and the three higher bits are set to zero.

Thus, according to the invention, the second encoded byte 206 advantageously cannot have a value of less than 16, corresponding to a length of three bytes, stored as "0001" in the four length bits 208. Therefore, neither the first encoded byte 204, nor the second encoded byte 206 can incidentally contain by virtue of the compression scheme an ASCII value for a flow control code of 15 or less.

In an alternative embodiment, the length which may be stored in the four length bits 208 may be in the range three bytes to sixteen bytes. According to this embodiment, only one is subtracted from the non-compressed length of the recurring sequence. While this reduces the maximum length of a recurring sequence which can be compressed by one byte, it makes the smallest possible value of the second byte 206 equivalent to ASCII 32. This occurs when the non-compressed length is three, from which one is subtracted to yield a value of two to be stored in the four length bits. A two is stored there as "0010" which makes the minimum value of the second byte 32. In this embodiment, then, no codes less than 32 can be inadvertently generated during compression.

The eleven bits of the offset can address locations 0 through 2047 in the packet. Thus the packet should be smaller than 2048 bytes long. In the preferred embodiment, the packet is 2002 bytes long.

Bytes and sequences of bytes which do not meet the criteria for compression are passed on without change.

In the alternative embodiment in which the length is stored in three bits and the offset is stored in 12 bits, the packet size should be no greater than 4096 bytes long, as this is the maximum length that can be addressed by the offset.

Figure 3B:
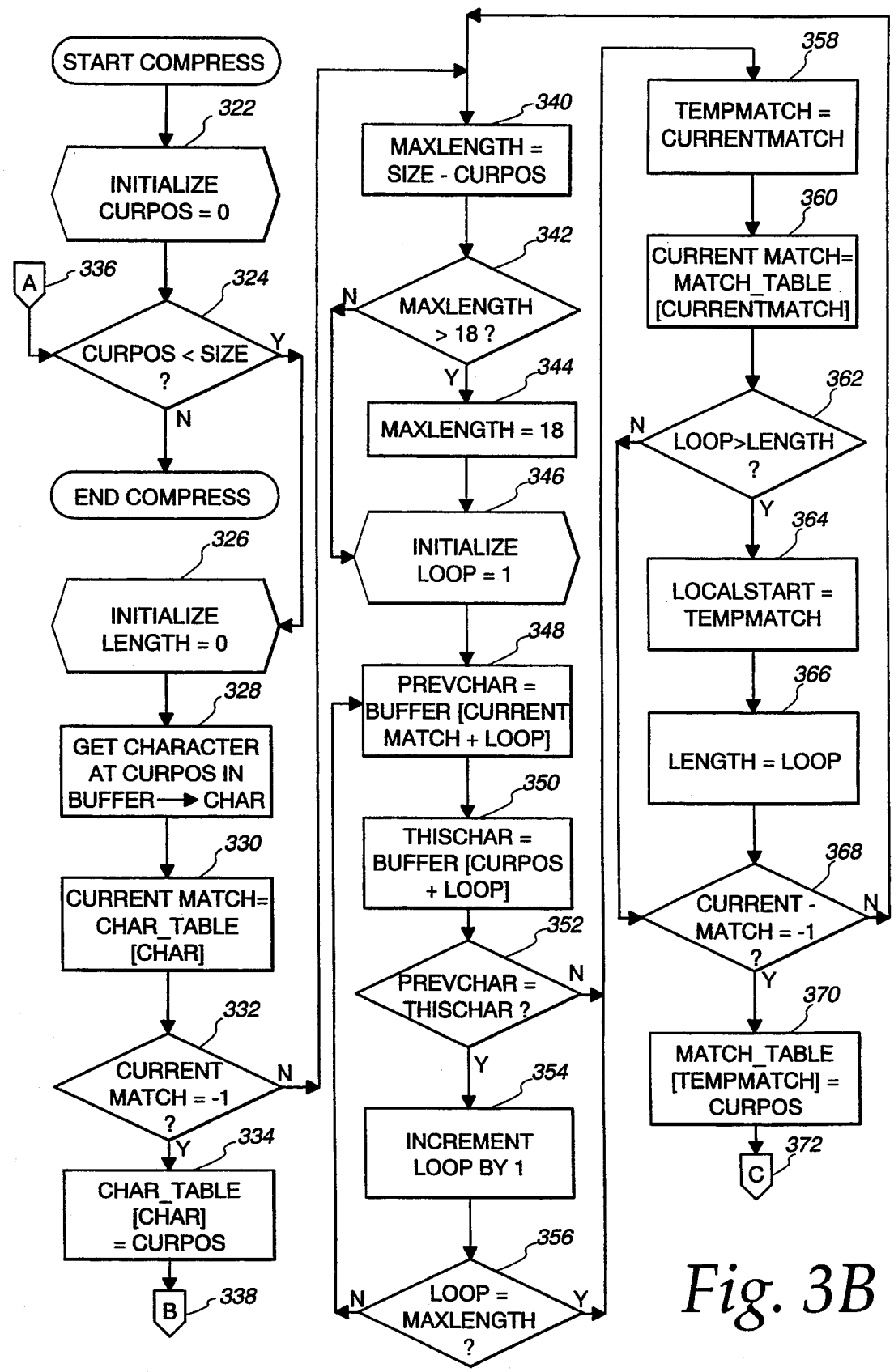
Figure 3C:
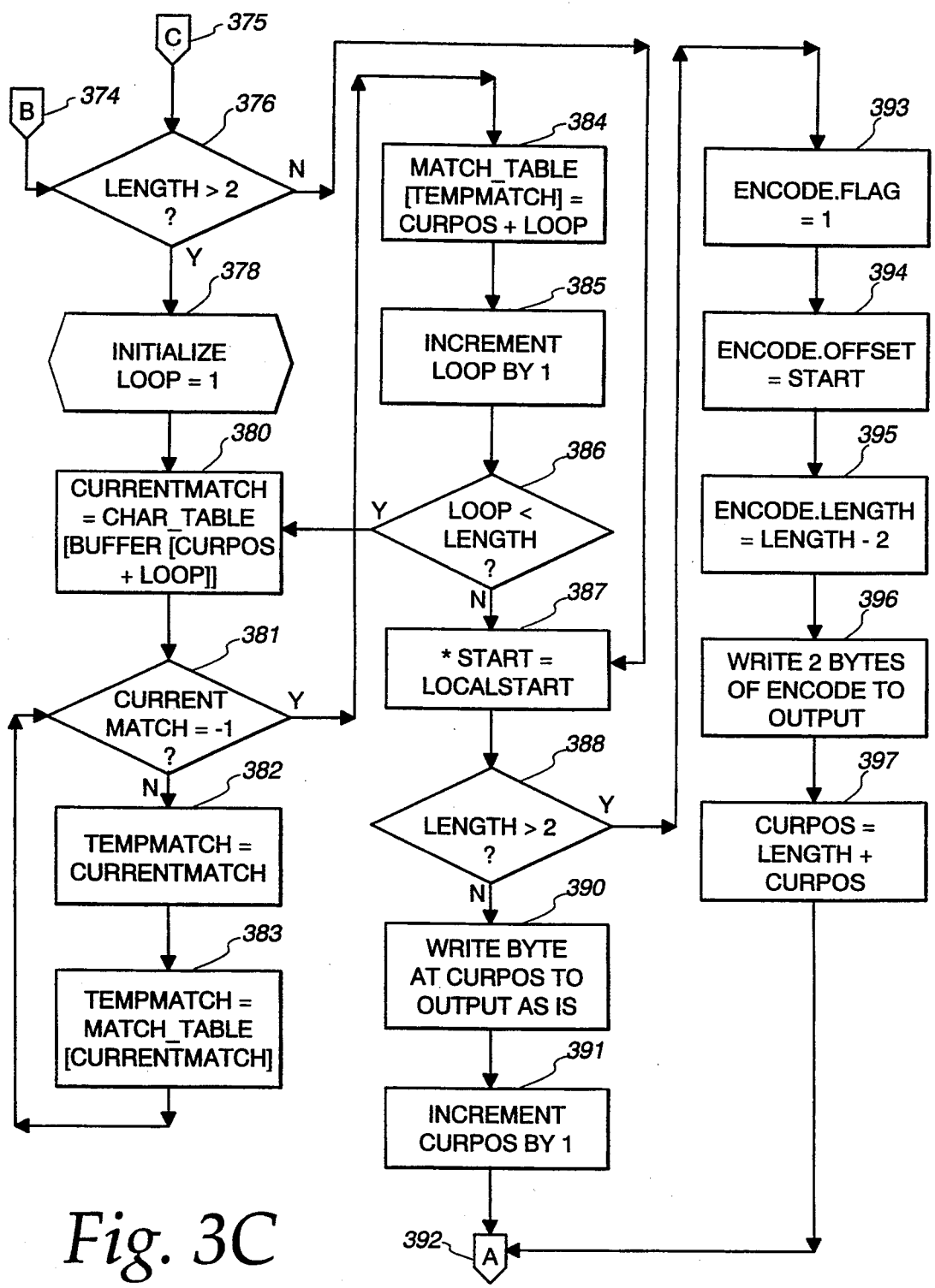

Turning now to FIG. 3, comprising related FIGS. 3A, 3B and 3C, an exemplary compression scheme is shown in flow chart form for implementing compression of an input file in packets of length 2002 bytes, wherein flow control codes of ASCII value less than 16 are not inadvertently generated. In FIG. 3A, the main processing loop is shown, which processes packets of 2002 bytes at a time, loaded into an input buffer, or less bytes if there are less than 2002 bytes left in the file to process. The loop finishes when there are no more characters left to packetize into the buffer.

In step 304, the input and output files are initialized, i.e., opened for processing. In step 308, the first 2002 bytes of the input file are loaded into the compression buffer, and the variable SIZE is equated to 2002. If there are less than 2002 bytes in the input file, all the bytes in the file are loaded into the buffer, and SIZE is set to the actual number of bytes. Step 310 checks to see if there are any bytes left to process. If there are none remaining, the input and output files are closed in step 320 and the program comes to a close.

If there are bytes in the buffer to compress, in step 312 a table CHARTABLE of 128 entries is initialized by loading −1 into all entries. Each entry corresponds to a first occurrence of one of the 128 ASCII codes in the buffer text. It is indexed with the ASCII value of each of the 128 characters, and stores the offset into the buffer of that character's first occurrence. In step 314, a table MATCH TABLE of 2002 entries is initialized by loading all entries with −1. MATCHTABLE is indexed by an offset of a previous occurrence of a given character, and stores at that location the offset of the next occurrence of the same character.

In step 316, the buffer is compressed according to the scheme shown in FIGS. 3B and 3C. The compression scheme writes the compressed data in packets which cannot be longer than 2002 bytes to the output file. The output file may be a disk file or an I/O port, such as a serial port in communication with an attached modem, or the like. In step 318, the next packet of 2002 bytes from the input file is loaded into the compression buffer.

A first portion of the compression scheme is shown in FIG. 3B. The byte in the compression buffer presently being processed is indicated by the variable CURPOS, which is initialized with zero in step 322. In step 324, the overall progress of compression of the buffer is monitored by checking whether CURPOS is still less than the SIZE of the buffer. Step 324 represents the beginning of a loop which treats each new character or sequence of characters in the buffer. The loop closes via off-page connector 336, labeled A, which leads from the end of the loop in FIG. 3C.

If it is determined there are still characters in the buffer to be processed in step 324, a variable LENGTH for holding the length of a recurring sequence is initialized to zero. The character at location CURPOS in the buffer is loaded into CHAR in step 328, and this character, which is one of the 128 standard ASCII codes, may be used to index into CHARTABLE. The entry at the table location pointed to by CHAR is loaded into CURRENTMATCH in step 330.

If the table entry has not yet been modified, it will be −1. This will be the case if the character CHAR has not yet been encountered in the buffer. CURRENTMATCH is tested for −1 in step 332, and if it is −1, the present location of CHAR in the buffer, namely CURPOS, is stored in the table in step 334.

If, however, the character has previously been encountered, the table entry will be some non-negative location in the buffer, representing the first occurrence of that character. A pair of nested loops is then entered, the first of which compares successive characters in each of the present sequence in the buffer, and the sequence which starts at the previous occurrence of the character in the buffer, as identified by the CHARTABLE entry. The second loop then checks for successive occurrences of the starting character throughout that portion of the buffer already processed, to find the longest prior sequence which matches the present sequence beginning with the character in CHAR at CURPOS.

In steps 340, 342 and 344, the maximum allowable length of the matching sequence is determined to be the lesser of 17 bytes or the number of bytes remaining to be processed in the buffer. If the present position CURPOS is more than 17 bytes from the end of the buffer, MAXLENGTH is set to 18, which by virtue of the manner of the loop will assure that no recurring sequence greater than 17 bytes is compressed, and thus the length can be encoded in the four length bits 208.

In step 346, a counter LOOP is initialized to one. Each of the successive characters of the present sequence, starting at CURPOS, and the successive characters of the previous sequence, starting at the location indicated by the entry from CHARTABLE loaded in CURRENTMATCH, are compared in steps 348, 350 and 352. As long as the characters in the two sequences continue to match, LOOP will be incremented in step 354. LOOP therefore holds the length of the recurring sequence. The loop is monitored at two decision steps 352 and 356, which ensure the recurring sequence cannot exceed 17 bytes in length.

Both steps 352 and 356 break out of the loop to a series of steps which check for even longer recurring matches of the present sequence at other prior occurrences of the starting character in CHAR. In step 358, CURRENTMATCH is temporarily stored in TEMPMATCH, and in step 360, CURRENTMATCH—which stores the offset into the buffer of the occurrence of the character CHAR found to recur at CURPOS—is used to index into MATCH TABLE. CURRENTMATCH is set to the contents at that indexed entry, which may be −1 or may contain the offset into the buffer of the next occurrence of the character CHAR after the prior occurrence which was just compared with the sequence at CURPOS.

As long as there are further occurrences of the starting character CHAR which occur in the buffer text which has already been compressed and the maximum compressible size has not been reached, the compression scheme will loop back to steps 340 through 356, until the longest matching sequence is determined. At step 362, the test is performed to determine whether the sequence beginning with the prior occurrence at CURRENTMATCH has generated a larger count of matching characters in LOOP than was previously encountered and stored to LENGTH in step 366. If LOOP is greater than the previously determined matching LENGTH, LOCALSTART is loaded with the offset of the start of the longer matching sequence from TEMPMATCH, and LENGTH is updated with the count in LOOP.

The table MATCH TABLE comprises an entry for each of the 2002 bytes in the buffer. Each entry corresponds to a character at that offset into the buffer, and contains the offset of the next occurrence of that same character in the buffer. Entries corresponding to locations not yet compressed remain initialized to −1. Therefore, in step 368, if CURRENTMATCH is −1, then the search for the longest prior matching sequence is brought to a close because the location in the buffer presently being processed has been reached. The entry for the prior occurrence of CHAR, as indexed using TEMPMATCH, is loaded with the new link to the present processing offset CURPOS.

Processing continues according to the scheme as shown in FIG. 3C, as connected to by off-page connector 372, labeled C. Therein are shown off-page connectors 374, labeled B, and 375, labeled C, which lead to step 376. Since a two-byte long recurring sequence is not compressed because it will not achieve a shortening of the text, step 376 determines if a compressed byte pair is written to output or the byte at CURPOS is written as is, and the MATCHTABLE is updated.

If LENGTH is less than 3, LOOP is initialized to 1 in step 378. In step 380, the next character in the buffer, at CURPOS plus LOOP, is used to index into CHAR TABLE. CURRENTMATCH is set to the contents at that index. In step 381, if CURRENTMATCH is not −1, then the process loops through the MATCHTABLE in steps 382 and 383 until an entry of −1 is found. Then, in step 384, that MATCH TABLE entry is replaced with the offset of the character in the buffer presently being processed, namely CURPOS plus LOOP. LOOP is incremented in step 385, and if LOOP is still less than LENGTH, then the next buffer character is obtained and the update continued at step 380.

If LOOP is not less than LENGTH, a pointer *START is set equal to the offset stored in LOCALSTART in step 387. This also serves as the branch-to location for one branch of the decision in step 376. According to step 388, if LENGTH is greater than 2, then processing branches to steps 393 through 397, wherein the recurring sequence is compressed by writing two bytes to the output comprising a compression flag, a length decremented by two, and an offset, as described above. CURPOS is increased by LENGTH, so that it points to the next character to be processed in the compression buffer.

If LENGTH is not greater than 2, the byte at CURPOS is written as is to the output and CURPOS is incremented by 1. The compression scheme loops back to step 324 shown in FIG. 3B at off-page connector 392.

It may be observed from the exemplary scheme for compressing the serial data stream as explained above, that the invention advantageously provides for what is known as "run length" encoding in the art. Run length encoding achieves a higher degree of compression. Run length encoding causes a series of like characters, such as the six bytes "000000" to be encoded as three bytes, where a first byte sent is simply an uncompressed "0", and the next two compressed bytes represent a character "0" repeated from the second position to the sixth position. Without run length encoding, this sequence might be stored as five bytes, the first three being "000" and the last two compressed bytes representing the last three zeroes by reference to the first three.

Data which is utilized internally in a mainframe or personal computer in words having other than 8- or 7-bit lengths, such as, for example, data which is encoded in other than ASCII format wherein characters may be represented by 12 or 16 bits, by way of example, can still be compressed by means of the present invention. The data stream of words is simply chopped up into appropriately sized bytes prior to compression, and strung together again to comprise the original words upon decompression. In order to assure that no bytes are sent with the high bit set to one incidentally, the data stream of words may be chopped into 7-bit fragments, to which is added a zero as an eighth, highest bit. This is then stripped off again after decompression, and the bits are strung together to compose the original data words. In this fashion, graphical information, which typically comprises bit-by-bit information, may also be compressed and decompressed.

Figure 4:
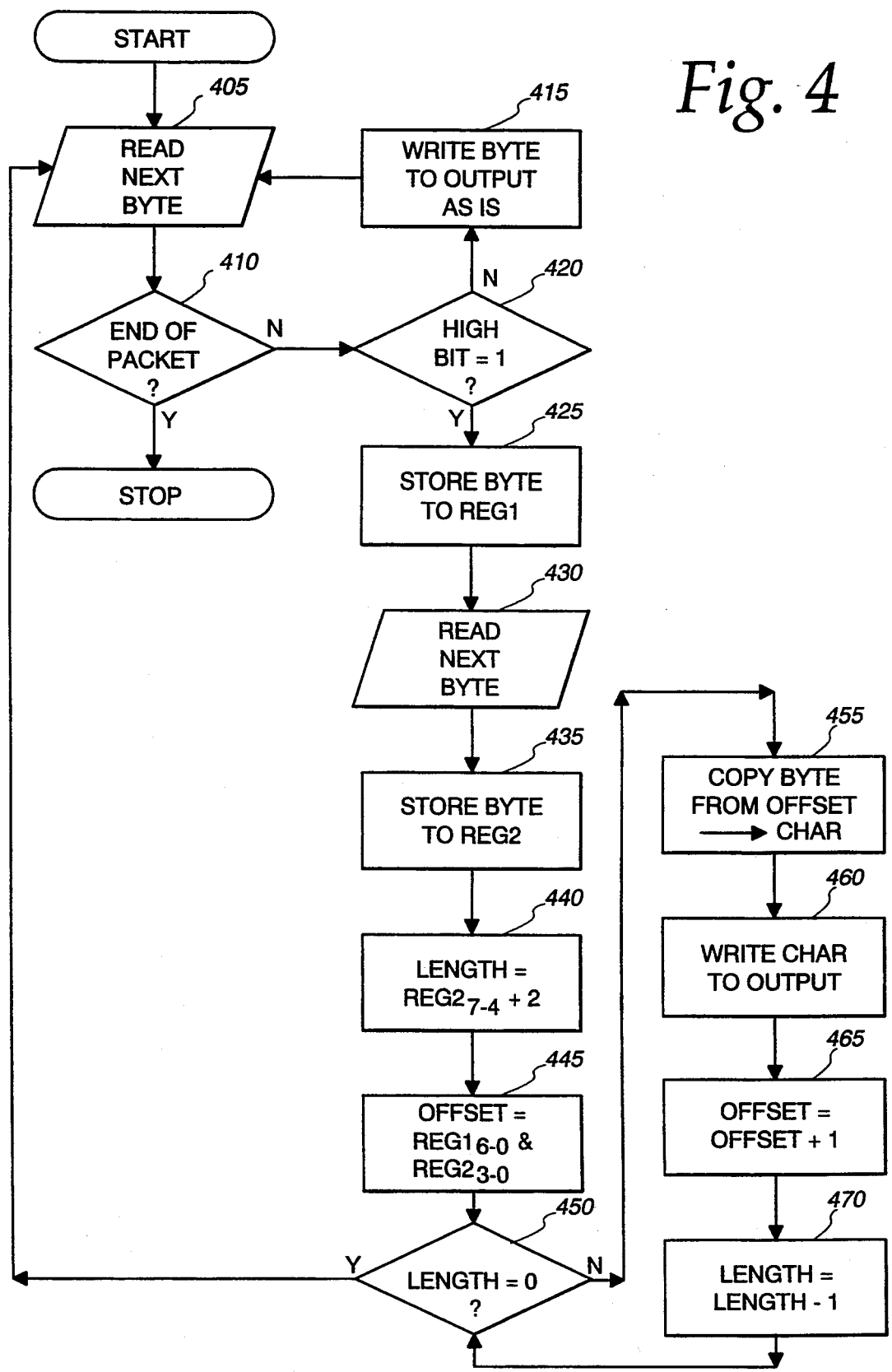
FIG. 4 is a flow chart of the decompression scheme for the print invention.

Turning now to FIG. 4, a decompression scheme for use in the present invention is shown. The flow chart depicted therein assumes proper input and output files or addresses have been initialized, and further shows the decompression of one packet. In step 405, the next byte is read from input. If it is determined, in step 410, that this byte indicates the end of the packet has been reached, the decompression loop for the packet is brought to a close. In step 420, the high bit of the byte is tested to determine if it is set to one. If not, the byte is written an a non-compressed byte to the output in step 415.

If the high bit is one, the byte is stored to a memory location such as a register REG1 in step 425. The next byte in the packet must be a second byte of a compressed pair, and this is stored in a register REG2 in steps 430 and 435. The length of the recurring sequence encoded by this byte pair is restored by adding two to the value encoded in the four high bits 7 through 4 of the second byte stored in REG2, which is then loaded to LENGTH in step 440. In step 445, the offset of the recurring sequence into the packet is reconstructed from the lowest 7 bits 6 through 0 of the first byte in REG1, concatenated with the lowest four bits 3 through 0 of the second byte in REG2, which is then loaded to OFFSET.

In step 450, if the LENGTH has decremented to zero, the decompression of the compressed sequence byte pair is brought to a close. If the LENGTH is not zero, the byte at the OFFSET into the present packet is copied in step 455, and written to the output in step 460. Already decompressed text of the packet must be suitably stored in a contiguous memory location or buffer for retrieval of this sort. In step 465, the OFFSET is incremented, and the LENGTH is decremented in step 470.

Figure 5:
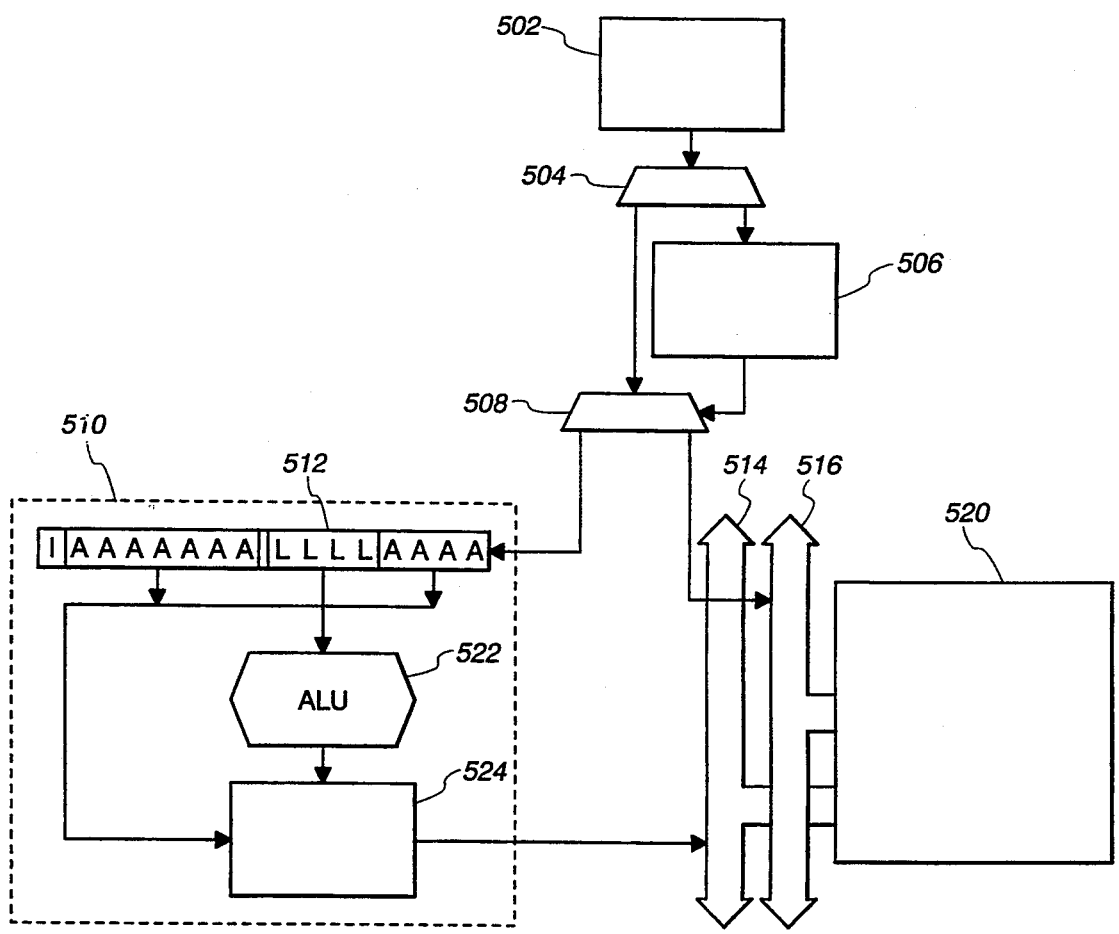
FIG. 5 is a block diagram of one embodiment of a system according to the present invention for receiving and decompressing data.

One embodiment of an apparatus for receiving and decompressing data packets compressed according to the present invention is shown in FIG. 5. Bytes of a packet received by a serial transmission device 502 are sent to multiplexer 504, which directs the byte to both a comparator 506 and a second multiplexer 508. The comparator 506 determines if the highest bit of a byte is set to one or not. If it is, it controls multiplexer 508 to direct the current byte, as well as the succeeding byte received from device 502, to a store 512 located in a decompression engine 510. The store 512 may be registers or memory locations. If the highest bit is zero, then the byte is directed to the buffer 520 via data bus 516.

The decompression engine 510 further comprises an arithmetic unit 522 disposed to add two to the four high bits of the second byte from store 512 to produce a length. An addressing unit 524 receives the length from unit 522 and the seven low bits of the first byte and the four low bits of the second byte from store 512 for concatenation into an eleven bit offset into the buffer. Addressing unit 524 then addresses the address bus 514 for the buffer 520 and controls the buffer such that bytes may be written from addressed locations via the data bus 516 to next available locations in the buffer, thereby achieving a reconstruction of a recurring sequence of compressed bytes from a previously received sequence of bytes stored in buffer 520.

According to an alternative embodiment of the present invention, data may be compressed such that ASCII codes less than 32 are not incidentally generated. This is achieved, for example, in the preceding, described compression and decompression schemes by subtracting just one instead of two from the true non-compressed length of a recurring sequence upon compression, for storage in the four length bits of the second byte of a compressed sequence byte pair. The maximum allowable length for compression of a recurring sequence is then 16 bytes instead of 17 bytes. Upon decompression, just one, instead of two, is added to the value encoded by the length bits. The smallest value which thus will be encoded by the length bits 208 is three minus one, or two, encoded as "0010", which does not permit the value of the second byte to be less than 32.

The present invention advantageously provides a means of compressing and decompressing data for serial transmission, which will not expand the data. Additionally, the receiving unit need not be switched between modes for reception of compressed and uncompressed data; one mode of decompression will suffice at all times to decompress compressed data and pass through non-compressed data without alteration. The compression scheme avoids creating ASCII codes less than 32 which are used as flow control codes for the serial data stream. The compression and decompression are furthermore advantageously carried out in a single-pass, thereby saving processing overhead as compared to multipass compression schemes.

Whereas the invention has been described in terms of setting the highest bit to one to represent compressed data, it lies within the scope of the invention to employ a reverse scheme where proper hardware is capable of interpreting the data stream appropriately such that a zero signal implies an "on" bit, and a one signal implies an "off" bit.

While the invention has been described with reference to a preferred embodiment, it is to be clearly understood by those skilled in the art that the invention is not limited thereto. Accordingly, the scope of the invention is to be interpreted only in conjunction with the appended claims.

What is claimed is:

1. A method for compressing a recurring sequence of three or more text codes in a data packet to be serially transmitted which does not inadvertently generate typical flow control codes, comprising the steps of:
   obtaining the offset into the packet of a previous occurrence of the recurring sequence,
   obtaining the length of the recurring sequence,
   setting the highest bit of a first compressed byte to one,
   storing the highest seven bits of said offset to the lowest seven bits of said first compressed byte,
   storing the lowest four bits of said offset to the lowest four bits of a second compressed byte,
   storing said length in the four highest bits of said second compressed byte, and
   transmitting in place of the recurring sequence said first and second compressed bytes at an offset into a transmitted serial data stream representing said packet.

2. A method according to claim 1, comprising the additional step of subtracting a value of two from said length before storing said length.

3. A method according to claim 1, comprising the additional step of subtracting a value of one from said length before storing said length.

4. A data retrieval system for retrieving a packet of compressed data from a remote database via a serial transmission line and decompressing the data, comprising:
   a serial transceiver for transmitting search requests to and receiving compressed data in packets from a remote computer having a database,
   a memory buffer for storing decompressed data from one of said received packets,
   a comparator for testing the highest bit of each byte of data in a packet received by said transceiver, and indicating that a first byte and a second, following byte of data are to be decompressed when the highest bit is one,
   means disposed to receive said first byte and said second, following byte, when said comparator indicates they are to be decompressed, for decompressing said first and second bytes by concatenating the seven lowest bits of said first byte with the four lowest bits of said second byte to provide an offset address into said buffer, and using the four highest bits of said second byte to provide the number of bytes to be copied from said buffer starting at said offset address, and writing the copied bytes to the next available location in said buffer.

5. A system according to claim 4, wherein said means is further disposed to add the value of two to the four highest bits to provide the number of bytes to be copied from said buffer starting at said offset address.

6. A system according to claim 4, wherein said means is further disposed to add the value of one to the four highest bits to provide the number of bytes to be copied from said buffer starting at said offset address.

7. A method for decompressing a packet of data received over a serial transmission line, comprising the steps of:
   decompressing a first byte in conjunction with a second, following byte, comprising a compressed byte pair, if the highest bit of said first byte is one, by:
   concatenating the lowest seven bits of said first byte with the lowest four bits of said second byte to provide an offset into the memory buffer,
   adding a length modification value to the highest four bits of said second byte to provide a number of bytes to be copied, and
   copying said number of bytes starting from the offset in said memory buffer;
   writing said copied bytes to the next available location in a memory buffer; and
   writing a received byte without changes to said memory buffer if the highest bit is zero, and the preceding received byte is a first byte of a compressed byte pair.

8. A method according to claim 7, wherein said length modification value is two.

9. A method according to claim 7, wherein said length modification value is one.

10. A method for compressing a recurring sequence of three or more text codes in a data packet to be serially transmitted which does not inadvertently generate typical flow control codes, comprising the steps of:
   obtaining the offset into the packet of a previous occurrence of the recurring sequence,
   obtaining the length of the recurring sequence,
   setting the highest bit of a first compressed data word to one,
   storing a highest portion of said offset to the lowest corresponding number of bits of said first compressed data word,
   storing a lowest, remaining portion of said offset to the lowest corresponding number of bits of a second compressed data word,
   storing said length in the remaining highest bits of said second compressed data word, and
   transmitting in place of the recurring sequence said first and second compressed data words at an offset into a transmitted serial data stream representing said packet.

11. A method according to claim 10, comprising the additional step of subtracting a value of two from said length before storing said length.

12. A method according to claim 10, comprising the additional step of subtracting a value of one from said length before storing said length.

* * * * *